(12) United States Patent
Nakasuji et al.

(10) Patent No.: US 6,307,209 B1
(45) Date of Patent: Oct. 23, 2001

(54) PATTERN-TRANSFER METHOD AND APPARATUS

(75) Inventors: Mamoru Nakasuji, Yokohama; Teruaki Okino, Kamakura, both of (JP)

(73) Assignee: Nikon Corporation, Tokyo (JP)

( * ) Notice: Subject to any disclaimer, the term of this patent is extended or adjusted under 35 U.S.C. 154(b) by 0 days.

(21) Appl. No.: 09/549,213

(22) Filed: Apr. 13, 2000

Related U.S. Application Data

(62) Division of application No. 09/204,620, filed on Dec. 1, 1998.

(30) Foreign Application Priority Data

Dec. 3, 1997 (JP) .................................................. 9-347319

(51) Int. Cl.$^7$ ............................ H01J 37/256; G03F 9/00
(52) U.S. Cl. ................................. 250/492.22; 250/492.2; 250/492.3; 250/396 R; 430/312; 430/296
(58) Field of Search ............................ 250/492.22, 492.2, 250/492.3, 396 R; 430/312, 296

(56) References Cited

U.S. PATENT DOCUMENTS

| | | | |
|---|---|---|---|
| 5,770,863 | * 6/1998 | Nakasuji | 250/492.2 |
| 5,798,194 | 8/1998 | Nakasuji et al. | 430/5 |
| 5,973,333 | 10/1999 | Nakasuji et al. | 250/492.23 |

* cited by examiner

*Primary Examiner*—Bruce Anderson
*Assistant Examiner*—Nikita Wells
(74) *Attorney, Agent, or Firm*—Klarquist Sparkman, LLP

(57) ABSTRACT

Charged-particle-beam pattern-transfer methods and apparatus are disclosed. Circuit patterns on a mask are divided into a plurality of fields, each field including respective connection ends. Fields that are to be adjacent as transferred to a substrate include a common portion of the circuit pattern in their respective connection ends. The common portions are projected onto the substrate to substantially overlap. The connection ends are illuminated by an image of a shaping aperture image that is illuminated with a charged-particle beam. The shaping-aperture image can be scanned across the fields so that wafer areas corresponding to the connection ends are exposed during exposure of the connecting adjacent fields and so that the dose received by the wafer is substantially uniform. The shaping-aperture image can be vibrated in a direction perpendicular to a scanning direction to illuminate connection ends. The vibration provides uniform dose on the wafer in areas corresponding to the connection ends. With such methods, circuit patterns are connected, even if the patterns from the fields are slightly offset.

4 Claims, 4 Drawing Sheets

PATTERN-TRANSFER METHOD AND APPARATUS

RELATED APPLICATION

This application is a division of application Ser. No. 09/204,620, filed Dec. 1, 1998.

FIELD OF INVENTION

The invention pertains to charged-particle-beam pattern-transfer methods and apparatus for transferring patterns from a mask to a wafer or other substrate.

BACKGROUND OF THE INVENTION

In conventional charged-particle-beam (CPB) pattern-transfer methods, an electron beam (or other charged-particle beam) is used to transfer a pattern from a mask to a wafer in order to obtain the high resolution imagery characteristic of CPB optical systems. Although charged-particle beams provide high-resolution imaging, pattern transfer using CPB pattern-transfer methods is generally slower than pattern transfer using optical radiation. Methods and apparatus have been disclosed that attempt to speed pattern transfer and increase throughput using CPB methods.

One CPB pattern-transfer method is known variously as cell-projection, character-projection, or block exposure. This method is suitable for transferring repetitive circuit patterns defined by a small area of the mask to a wafer or other substrate. In this method, several so-called "unit patterns" are defined on the mask and these unit patterns are repeatedly transferred onto the wafer using a charged-particle beam. For this method to be useful, the unit patterns should be no larger than about 5 $\mu$m by 5 $\mu$m as projected onto the wafer. In addition, the patterns to be transferred must consist primarily of repeats of the unit patterns and the method is unsuitable for patterns that are not repetitive. Using this method in the production of semiconductor integrated circuits such as DRAMs, throughput can be as much as ten times larger than using methods that do not take advantage of pattern repetitiveness.

Another method for increasing throughput in CPB pattern transfer is a demagnifying pattern-transfer method disclosed in laid-open Japanese Patent Document No. Hei 5-160012. In this technique, a mask is used to define the patterns for an integrated circuit. The mask is divided into multiple fields that are further divided into a plurality of subfields. An electron beam illuminates a subfield and a demagnified image of the subfield is projected onto the wafer with a two-stage projection lens system. The images of the patterns in the remaining subfields are successively projected onto the wafer so that the projected subfield patterns are aligned to form the patterns for the integrated circuit. Because the electron beam does not illuminate the entire mask simultaneously, alignment of the projected subfields is an important consideration. To achieve accurate subfield placement, the CPB optical system can be adjusted to improve the placement and resolution of each subfield image. This method is referred to as a "divisional" pattern-transfer method and is disclosed in, for example, U.S. Pat. No. 5,260,151. This method has not been successfully demonstrated for commercial production of integrated circuits.

The CPB pattern-transfer methods described above are useful only if the patterns in the subfields are accurately stitched together on the wafer. Laid-open Japanese Patent Application No. Sho 63-1032 discloses a method for improving the accuracy with which patterns are stitched together. In this method, a common pattern is formed in edge portions of two subfields whose pattern images are to be adjacent on the wafer. The subfields are projected onto the wafer so that the images of the common pattern in the two subfields overlap. The common pattern formed in the edge portions is exposed twice at a relatively low dose in different exposures so that the total dose (i.e., the total exposure to the electron beam) in the edge portions is approximately the same as that of other areas.

Unfortunately, the JP 63-1032 method is only useful in pattern transfer using a variably shaped beam or a focused beam, and no effective method for improving the accuracy of the pattern stitching, which is generally applicable to a mask-pattern transfer process using an electron beam, has been established yet. In particular, a method for efficient control of the dose distribution within a unit exposure area has not been proposed yet.

In shaped-beam pattern-transfer methods, the charged-particle beam is generally shaped with a shaping aperture. The boundary of a subfield transferred to a wafer is defined by the image of the shaping aperture on the mask instead of an edge or other feature on the mask. Distortion or blur of the shaping-aperture image degrades the quality of the transferred patterns. The illuminating charged-particle beam scans the entire field. If the field is large, then the image of the shaping aperture exhibits distortion, particularly at the most off-axis portions of the field. If the distortion is large, then the total exposure varies in the double-exposure area on and near the pattern-connection boundary. This can cause inaccurate stitching of the patterns in adjacent fields.

It will be apparent from the foregoing that improved methods and apparatus are needed for CPB pattern transfer.

SUMMARY OF THE INVENTION

According to one aspect of the invention, pattern-transfer methods are provided for transferring a pattern to a substrate. In one embodiment, the pattern is divided into a plurality of fields, each field having connection ends for connecting to patterns of an adjacent field as transferred to the substrate. The connection ends transferred adjacent to each other on the substrate contain a common pattern that is projected from the fields to substantially overlap on the substrate.

In another embodiment, the fields are divided into subfields and the subfields are illuminated with an image of a shaping aperture that is illuminated with a charged-particle beam (CPB). The image of the shaping aperture is stepped or scanned across the fields so that images of the subfields are projected onto the substrate. The images of the common patterns of adjacent fields are projected onto substantially the same substrate location and are thus exposed by the CPB at least twice.

In yet another embodiment, the image of the shaping aperture is vibrated as the image is scanned or stepped across the fields. In one example, the direction of vibration of the shaping aperture is perpendicular to the stepping of scanning direction. The vibration of the shaping-aperture image provides a variable CPB dose on the wafer from connection ends of the mask illuminated by the vibration of the shaping-aperture image. Connection ends are provided that extend along the stepping or scanning direction. Exposure of connection ends of adjacent fields with the vibration of the shaping-aperture image connects the adjacent fields so that the dose on the wafer is uniform. The dose on the wafer from exposure of a single connection end produces a non-uniform dose but the sum of the non-uniform doses from several connection ends is a uniform dose. The dose received by the substrate can vary linearly in the connection ends. The linearly varying dose connects patterns from adjacent fields even if the connection ends are displaced from exact overlap as projected on the substrate.

According to another aspect of the invention, pattern-transfer apparatus for transferring a pattern from a mask to a sensitized substrate are provided. The pattern is divided into a plurality of overlapping pattern segments. The pattern segments define fields on a mask and the overlapping portions of the pattern segments define connection ends of the fields. An illumination system illuminates the mask and a projection lens system images patterns from the mask onto the substrate. The illumination system includes a shaping aperture for shaping the transverse profile of the CPB. The illumination system images the shaping aperture onto the mask to illuminate subfields of the fields and includes deflectors for scanning or stepping the image of the shaping aperture on the mask. Beam vibration deflectors can be provided to vibrate the image of the shaping aperture to produce a linearly varying dose in the connection ends so illuminated. The vibration frequency is such that the vibration speed is much larger than the stepping or scanning speed.

According to yet another aspect of the invention, pattern-transfer methods for transferring a pattern to a substrate are provided. The pattern is formed on the mask by dividing the pattern into a plurality of stripes, each stripe extending in a y-direction of the mask. The stripes are divided into a plurality of fields, the fields extending in an x-direction of the mask, the x-direction being perpendicular to the y-direction. The fields include connection ends for connecting the patterns from adjacent fields on the substrate. Connection ends that are to overlap on the wafer contain a common pattern.

Subfields of the fields are illuminated with an image of a shaping aperture that is illuminated with a CPB. The shaping-aperture image is moved across the fields in the x-direction by deflecting the CPB and in the y-direction by mechanically moving the mask. Patterns in the connection ends of the fields are transferred to the wafer to overlap the patterns from corresponding connection ends of adjacent fields. The sum of the doses received by the substrate by exposure to two fields is substantially equal to the dose received by exposure of the substrate corresponding to non-connection end portions of the fields.

Y-connection ends can be formed that are illuminated by vibrating the image of the shaping aperture in the y-direction (perpendicular to the stepping or scanning direction). The shaping-aperture image is scanned in the x-direction and vibrated in the y-direction to illuminate the common patterns of the y-connection ends as the shaping-aperture image is deflected across the fields. The vibration frequency is selected to be greater than the scanning speed and the amplitude of the vibration can be varied as a function of distortion or other aberrations of the shaping-aperture image. Because the shaping-aperture image is generally more distorted away from a CPB optical axis than close to the axis, the vibration amplitude is reduced in the more off-axis portions of the fields.

The foregoing and other features and advantages of the invention will be apparent from the following detailed description that proceeds with reference to the accompanying drawings.

DETAILED DESCRIPTION

Figure 1:
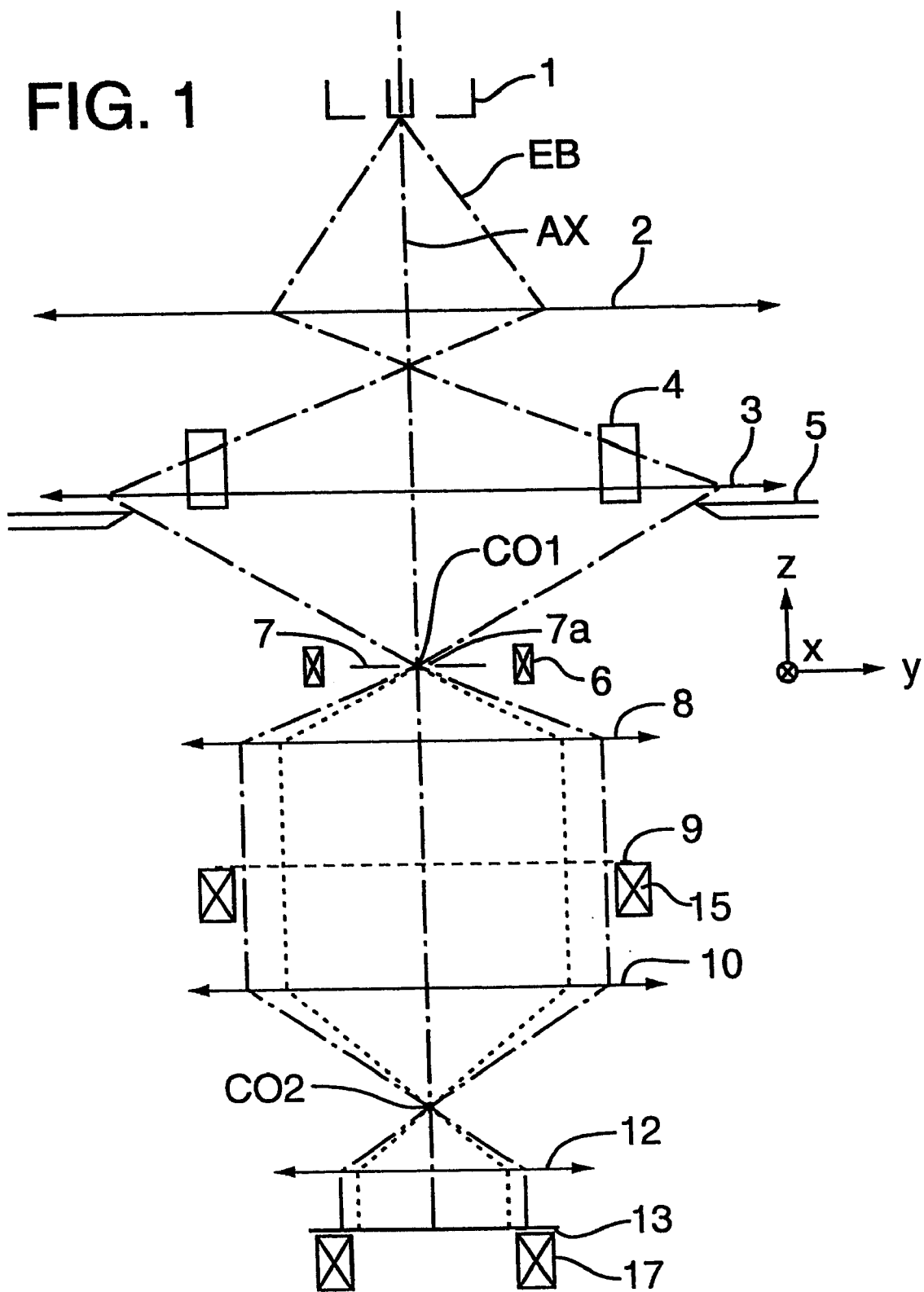
FIG. 1 is an elevational sectional view of a charged-particle-beam (CPB) pattern-transfer apparatus according to the invention that transfers patterns from a mask to a wafer using an electron beam.

With reference to FIG. 1, a charged-particle beam (CPB) pattern-transfer apparatus includes an electron gun 1 that produces an electron beam EB that propagates along an axis AX. (For convenience in the following descriptions, a rectangular coordinate system having x- and y-axes is used.) Condenser lenses 2, 3 receive the electron beam EB and form a crossover at an axial location CO1. The condenser lenses 2, 3 serve as a zoom lens to selectively vary the current density of the electron beam EB incident to a mask 9. A blanking aperture plate 7 defining an aperture 7a is situated along the axis AX at or near a plane containing the axial location CO1 and perpendicular to the axis AX. This plane is referred to hereinafter as the "crossover plane." A blanking deflector 4 is situated gun-wise (upstream) of the condenser lens 3 and is controlled to selectively deflect the crossover of the electron beam EB away from the location CO1 out of the blanking aperture 7a, and onto the blanking aperture plate 7, preventing the electron beam EB from reaching the mask 9.

A beam-shaping aperture 5 is situated mask-wise (downstream) of the condenser lens 3 to shape the cross-section of the electron beam EB. An illumination lens 8 positioned mask-wise (downstream) of the blanking aperture plate 7 collimates the electron beam EB and images the beam-shaping aperture 5 on the mask 9. An image of the beam-shaping aperture 5 formed by the illumination lens 8 on the mask 9 is referred to hereinafter as the "shaping-aperture image." The CPB pattern-transfer apparatus of FIG. 1 forms a demagnified image of the beam-shaping aperture 5 on the mask 9 in order to reduce the current density of the electron beam EB at the beam-shaping aperture 5, thereby reducing heating of the beam-shaping aperture 5 by the electron beam EB.

A beam-vibration deflector 6 is located mask-wise (downstream) of the beam-shaping aperture 5 at or near the crossover plane. The beam-vibration deflector 6 is situated to deflect the electron beam EB (and the shaping-aperture image) in a direction perpendicular to the axis AX. Multiple subfield-selection deflectors (not shown in FIG. 1) are positioned at or near the crossover plane and aligned with the beam-vibration deflector 6. The subfield-selection deflectors are situated to deflect the shaping-aperture image in the x-direction across the mask 9.

The mask 9 is retained in a plane perpendicular to the axis AX by a mask stage 15 so that the mask 9 extends in both the x- and y-directions. Lenses 10, 12 and a deflector (not shown in FIG. 1) are situated between the mask 9 and a sensitive substrate ("wafer") 13. The lenses 10, 12 form a demagnified image of the mask 9 at a selected location on the wafer 13. In particular, the lenses 10, 12 form a demagnified image of a region of the mask 9 illuminated by the shaping-aperture image on the wafer 13. A deflector (not shown in FIG. 1) is situated to deflect the demagnified image parallel to the x-axis and scan the demagnified image across the wafer 13. The wafer 13 is coated with a resist sensitive to the electron beam EB. The demagnified image of the mask 9 formed on the wafer 13 with the electron beam EB exposes the resist, transferring the patterns from the mask 9 to the wafer 13.

The mask stage 15 is movable in the x- and y-directions. The wafer 13 is retained by a wafer stage 17 that is movable in the x- and y-directions. The mask stage 15 and the wafer stage 17 are continuously movable in opposite directions along the y-axis. The electron beam EB (and the shaping-aperture image) illuminates the mask 9 and is deflected along the x-direction within a field, thereby transferring the pattern in the illuminated portion to the wafer 13. The mask stage 15 and the wafer stage 17 are then stepped in the x-direction to illuminate and transfer patterns in another portion of the mask 9 to the wafer 13. Accurate position-monitoring systems as known in the art, such as laser interferometers (not shown), are provided to determine the positions of the mask stage 15 and the wafer stage 17. In addition, alignment and deflection controllers (not shown in FIG. 1) as known in the art are provided to control the deflection of the electron beam EB (and the shaping-aperture image) and the step-wise movement of the mask 9 and the wafer 13 so that circuit patterns join correctly on the wafer 13.

Figure 2:
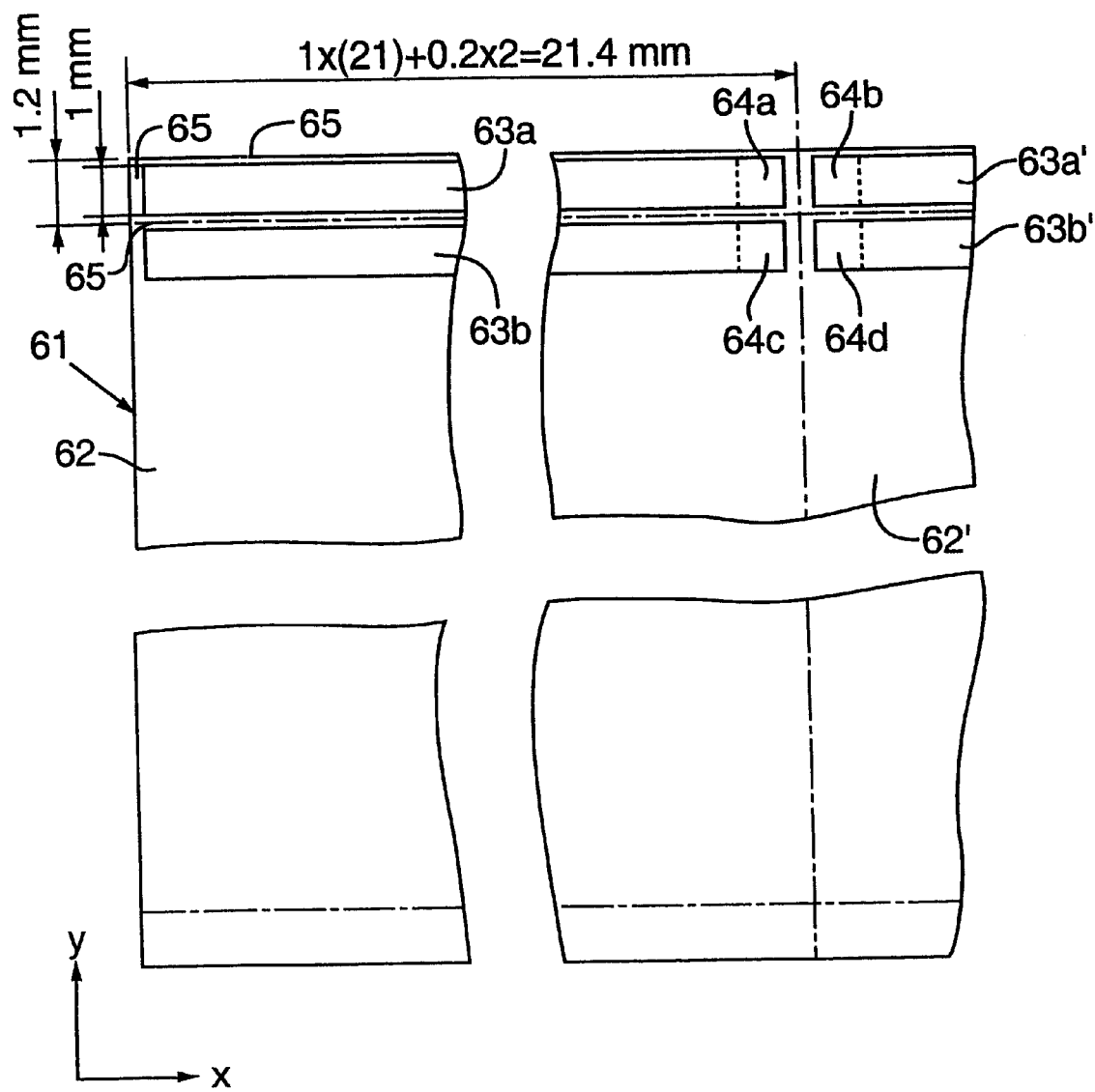
FIG. 2 is a plan view of a mask, illustrating a division of a pattern defined by the mask into fields.

With reference to FIG. 2, a circuit pattern defined by a patterned area 61 of the mask 9 is divided into a plurality of patterned stripes such as exemplary stripes 62, 62'. The stripes 62, 62" are further divided into a plurality of fields such as exemplary fields 63a, 63b of the stripe 62 and exemplary fields 63a', 63b' of the stripe 62". The fields 63a, 63b, 63a', 63b' are illuminated and scanned by deflecting the shaping-aperture image with the subfield-selection deflectors. In one illustrative embodiment, the patterned area 61 is divided into five patterned stripes similar to the stripes 62, 62' and each of the patterned stripes includes 144 fields similar to the fields 63a, 63b. Other divisions of the patterned area 61 are possible. In the embodiment illustrated in FIG. 2, the x- and y-dimensions of the fields 63a, 63b, 63a', 63b ' are approximately 21 mm and 1 mm, respectively.

The fields 63a, 63b, 63a', 63b' have respective x-connection ends 64a, 64c, 64b, 64d containing interconnection patterns. As shown in FIG. 2, the x-connection end 64a of the field 63a is adjacent to the x-connection end 64b of the adjacent field 63" on the mask 9. The patterns in the fields 63a, 63a' are adjacent on the wafer 13 after transfer and contain a common pattern in the connection ends 64a, 64b. The common patterns in the connection ends 64a, 64b are transferred so as to substantially overlap on the wafer 13. Similarly, the connection end 64c of the field 63b and the connection end 64d of the field 63b' contain a common interconnection pattern that is transferred to overlap on the wafer 13. An unpatterned area 65 surrounds the fields 63a, 63b, 63a', 63b' and reinforces and stiffens the mask 9. The images of the fields 63a, 63b, 63a', 63b' are deflected during pattern transfer so that the unpatterned area 65 is not transferred to the wafer 13. The unpatterned area 65 separates the connection ends 64a, 64b by 0.4 mm and provides a 0.2 mm space between the fields 63a, 63a' and an edge of the patterned region 61.

Because CPB optical systems generally are unable to form high resolution images of points distant from an optical axis of the CPB optical system, patterns from small regions of the fields 63 are illuminated with the shaping-aperture image and projected onto the wafer 13. These small regions are referred to herein as "subfields." Projecting the patterns from the mask 9 one subfield at a time and accurately joining the patterns on the wafer 13 permits high-resolution pattern transfer.

During pattern transfer, the respective connection ends 64a, 64b and 64c, 64d are projected to overlap on the wafer 13. Accordingly, the patterns of all the fields are connected to form a circuit pattern on the wafer 13. In the example of FIG. 1, the mask patterns are demagnified by ¼ on the wafer 13 and the x- and y-dimensions of the complete pattern on the wafer 13 are 25 mm and 36 mm, respectively.

Patterns are transferred from the mask 9 to the wafer 13 by illuminating subfields (i.e., portions of the fields 63a, 63b, 63a', 63b') of the mask 9 with the image of the image of the shaping aperture. The shaping-aperture image is too small to completely illuminate a field so the shaping-aperture image is deflected in the x-direction to scan. In one example, the shaping-aperture image is a 1 mm by 1 mm square, while the x-and y-dimensions of the fields are 21 mm and 1 mm, respectively. By scanning the fields with the shaping-aperture image and deflecting the image of the illuminated subfield of the mask 9 to a selected location of the wafer 13, the pattern on the mask 9 is transferred onto the wafer 13. The x-dimension of the connection end 64a is approximately equal to the x-dimension of the shaping-aperture image, neglecting distortion.

The 1-mm square shaping-aperture image is demagnified to a 250-$\mu$m square on the wafer 13.

Figure 3:
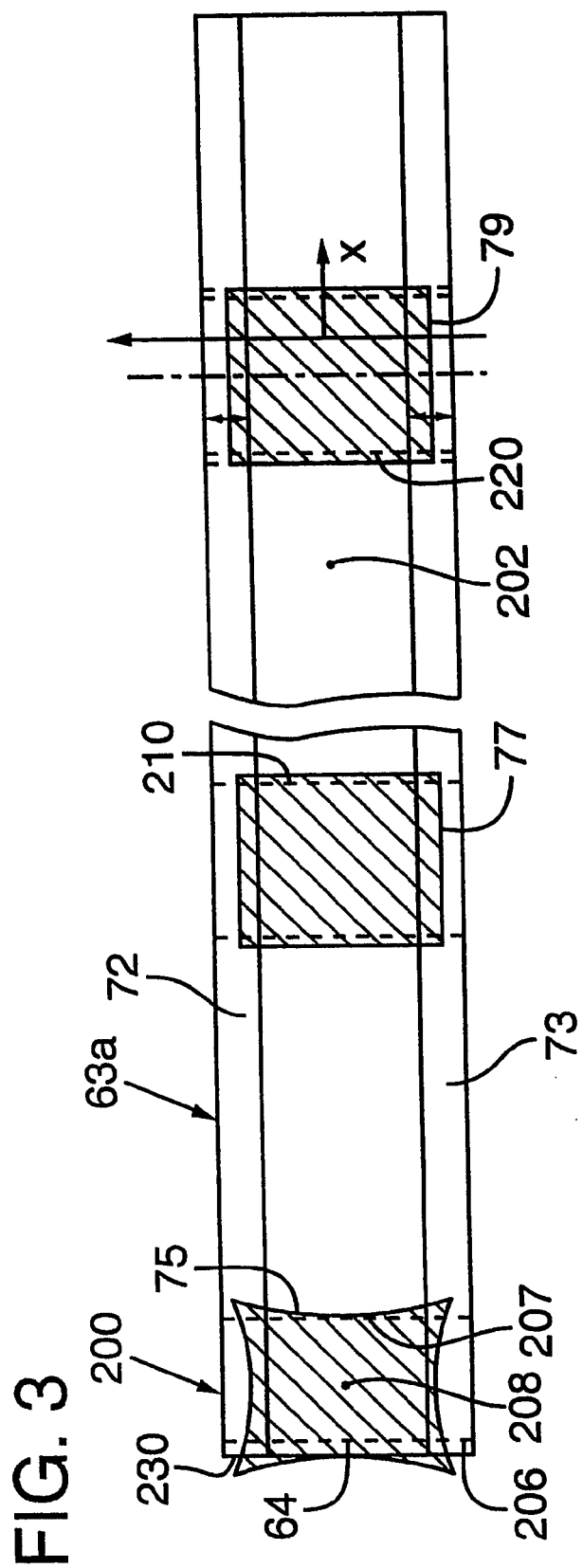
FIG. 3 is a plan view of a portion of the mask of FIG. 2 illustrating illumination of the mark by an image of a shaping aperture.

With reference to FIG. 3, the field 63a includes exemplary subfields 200, 210, 220, corresponding to exemplary shaping-aperture images 75, 77, 79 corresponding to images of the beam-shaping aperture 5 at the subfields 200, 210, 220. The shaping-aperture images 75, 77, 79 extend sufficiently in the y-direction to fully illuminate the y-dimension of the field 63a (as well as the fields 63b, 63a', 63b') while being scanned in the x-direction across the field 63a, sequentially illuminating the entire length of the field 63a, including the connection end 64a. The field 63a' and the connection end 64b are similarly illuminated and scanned. With further reference to FIG. 3, the field 63a includes y-connection ends 72, 73. The y-connection ends 72, 73 have the same patterns as those of corresponding y-connection ends of respective adjacent fields in the stripe 62. Thus, the field 63a includes the connection end 64a and the y-connection ends 72, 73 along three sides of the field 63a. Other configurations include providing connection ends along one, two, or four sides of the field 63a. As shown in FIG. 2, the fields 63a, 63b are at the x-direction perimeter of the patterned area 61 and include no connection ends towards the perimeter. Similarly, connection ends such as the connection ends 72, 73 need not be provided at the y-direction perimeter of the patterned area 61.

Before beginning pattern-transfer from the field 63a, the mask 9 is moved so that the axis AX intersects the field 63a at or near a geometrical center 202. Exposure of the wafer 13 to the patterns in the field 63a begins by unblanking the electron beam EB and illuminating the subfield 200 of the field 63a with the shaping-aperture image 75.

Because the subfield 200 is displaced from the axis AX, the shaping-aperture image 75 is generally distorted, as indicated in FIG. 3.

The subfield 200 is initially exposed by the shaping-aperture image 75. Deflectors then scan the shaping-aperture image 75 in the x-direction to illuminate the subfields 210, 220. Because the image of the shaping-aperture image is scanned in the +x-direction at a constant rate, a most off-axis portion 206 of the subfield 200 receives a only brief exposure to the electron beam EB. As scanning of the shaping-aperture image 75 continues, the most off-axis portion 206 is no longer exposed. However, a most on-axis portion 207 continues to be exposed until the shaping-aperture image 75 scans completely through the subfield 200.

Therefore, the most on-axis portion 206 receives a longer exposure to the electron beam EB. An intermediate portion 208 receives a shorter exposure than the most on-axis portion 207 but longer than that of the most off-axis portion 206.

The subfields 210, 220 are exposed by respective shaping-aperture images 77, 79 that scan completely through the respective subfields and exposure is substantially uniform. Subfields at the perimeter of the patterned area 61 are also uniformly exposed as the corresponding shaping-aperture image scans completely through such subfields. Because the subfields 210, 220 are closer to the axis AX than the subfield 200, the shaping-aperture images 77, 79 exhibit less distortion than the shaping-aperture image 75. The shaping-aperture image 77 illuminates the subfield 210 and is scanned completely through the subfield 210. Therefore, exposure of the subfield 210 is substantially uniform. The exposure of the subfield 220 is also substantially uniform because a shaping-aperture image is scanned through the entire subfield 220.

The deflection range of the electron beam EB is slightly greater than the x-dimension of the field 63a, so that the shaping-aperture image 75 can be offset from the connection end 64a.

When transfer of patterns from the stripe 62 is complete, the electron beam EB is blanked, and the mask stage 15 and the wafer stage 17 are stepped in the x-direction to transfer patterns from the stripe 62' to the wafer 13.

As used herein, "dose" is defined as total CPB charge deposited per unit area on the wafer 13. Dose at a particular location of the wafer 13 is therefore proportional to the current density of the electron beam EB and the duration for which the electron beam EB is incident to the wafer 13. In addition, because the actual dose on the wafer 13 depends on the circuit patterns defined by the mask 9 and to which the wafer 13 is exposed, dose as used herein refers only to the available dose, i.e. the dose received at a location on the wafer 13 in the absence of mask pattern features that block or scatter the electron beam EB. The available dose can be limited by a generalized absorption or scattering of the electron beam EB by the mask 9, but does not include limitations caused by circuit pattern features.

Figure 4:
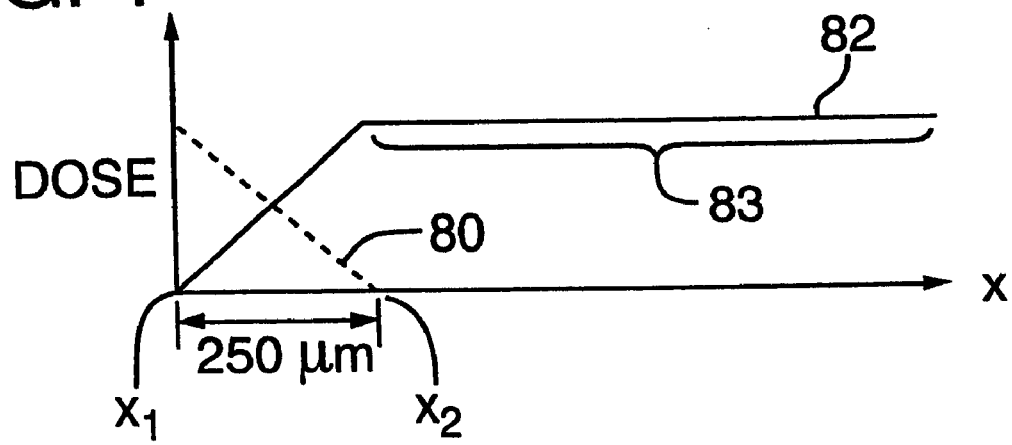
FIG. 4 is a graph of electron-beam exposure as a function of position on a substrate in a substrate region exposed to patterns from two fields.

FIG. 4 illustrates the dose received by the wafer 13 in a region corresponding to the field 63a as a function of x-direction distance from an edge 230 (see FIG. 3) obtained by scanning the shaping-aperture image as described above. A solid line 82 indicates the dose received by scanning the field 63a and a dashed line 80 indicates the dose received by scanning an adjacent field, such as the field 63a'. The doses corresponding to lines 80, 82 are doses obtained assuming no distortion or other aberration in imaging the beam-shaping aperture 5. Because the shaping-aperture image is scanned in the x-direction at a constant speed, the dose is constant for locations greater than 250 $\mu$m (the size of the shaping-aperture image at the wafer 13) from the edge 230. Regions near the edge 230 of the field 63a receive doses proportional to the x-distance from the edge, while the more on-axis subfields 210, 220 receive a uniform dose. The connection-end 64a is at the edge 230 and receives a lower dose than more on-axis areas. The dose received at the wafer 13 obtained by exposing the field 63a' produces the dose indicated by the dashed line 80. As in the exposure of the connection end 64a, exposure of the connection end 64b results in a dose dependent on the x-coordinate and a linear dose distribution for the connection end 64b. Dose is substantially uniform on the wafer 13 in regions corresponding to other portions of the field 63a'.

Thus, the scanning of the fields 63a, 63a' exposes the wafer 13 at a wafer area corresponding to the connection ends 64a, 64b. As shown in the graph of FIG. 4, the region of length 250 $\mu$m between $x_1$ and $x_2$ receives exposure from scans of both of the fields 63a, 63a'.

Total dose received in this region of the wafer is a sum of the doses indicated by the lines 80, 82. This dose is substantially the same as the dose corresponding to more on-axis subfields. As shown in FIG. 4, each field is a so-called a full-passage field, i.e., the electron beam EB scans the entire field area in a single scan.

Subfields of the field 63a greater than 250 $\mu$m from the edge 230 receive a substantially uniform dose because the entire shaping-aperture image is scanned through such subfields. However, dose uniformity can be limited by other factors such as non-uniformities in the current density of the electron beam EB at the beam-shaping aperture 5, or distortion of the shaping-aperture image as illustrated by the shaping-aperture image 75 of FIG. 3.

As illustrated by the solid line 82 of FIG. 4, the dose received during exposure of the field 63a is 100% at $x_2$, decreasing linearly to 0% at $x_1$. At a distance of 250 $\mu$m from the left end (coinciding with the right end of the previous field), the dose becomes 0%. This is achieved by blanking the electron beam exactly when the aperture image of the beam comes into alignment with the right-end connection end 64 of the previous field, which is also the left-end connection end 64 of the current field. Although, in this example, the dashed line 80 indicates a dose for the previously exposed field for the sake of simplifying the explanation, in the actual exposure the dashed line may be a dose for the field exposed after the current field.

Summing the dose for the fields 63a, 63a' produces a full dose for the portion of the wafer 13 patterned by the connection ends 64a, 64b.

Therefore, the dose received by the wafer throughout the field 63a is substantially uniform, corresponding to the dose indicated by a horizontal portion 83 of the solid line 82.

The area on the wafer corresponding to the connection ends 64a, 64b thus is exposed twice so that the total dose in this area is substantially the same as the dose received by the wafer 13 in areas that are not at ends of fields.

Figure 5:
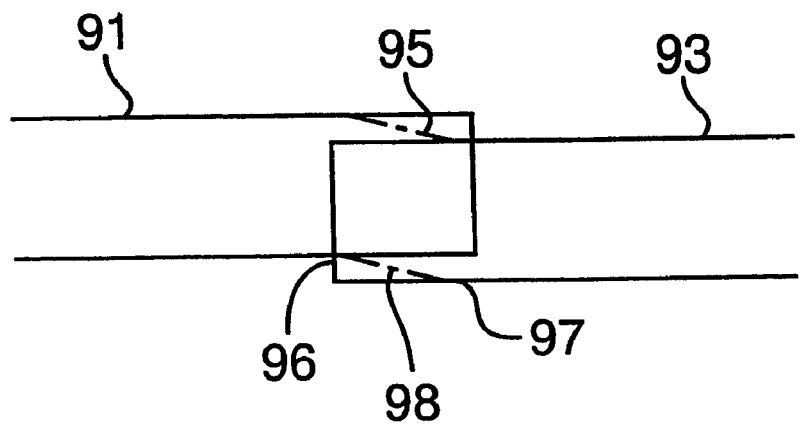
FIG. 5 is a plan view of connection of adjacent fields resulting from the electron-beam exposures shown in FIG. 4.

Exposing the connection ends 64a, 64b so that the respective patterns overlap on the wafer and the dose received by the wafer 13 is substantially uniform provides accurate interconnection of patterns from the fields 63a, 63b. In addition, even if the patterns 63a, 63b are not perfectly aligned as projected on the wafer 13, the patterns interconnect. With reference to FIG. 5, an edge 91 corresponding to a first field and an edge 93 corresponding to a second field connect along a line 95. This is because the dose for the first field (corresponding to the edge 91) is dominant in the left half of the common pattern-connection area, and the dose for the current field (corresponding to the edge 93) is dominant in the right half of the pattern-connection area. For example, at a point 96 along the line 95, the dose receive is primarily from the exposure of the first field. At a point 97, the exposure is primarily from exposure of the second field. A point 98 receives a substantial dose from exposure of each of the first and second fields.

If patterns from the field 63a (and the other fields) are transferred by stepping the shaping-aperture image across the mask 9 instead of scanning, then the exposure time for the connection end 64a is selected to be about 50% of the exposure time for more on-axis subfields, such that the subfields 210, 220. The total dose on the wafer 13 in the common pattern-connection area from exposure of the fields 63a, 63b is then substantially the same as the dose corresponding to other portions of the fields.

One of the y-end connection ends of the current field is projected onto the same position as the y-end connection end of the previous field and, therefore, the total dose on this pattern-connection area is the sum of the doses indicated by the solid line 82 and the dashed line 80 (FIG. 4), as in the x-end connection end explained with reference to FIG. 4. Even if the connection ends of two adjacent fields are slightly offset from each other, the two fields are connected smoothly because of the sloped dose distribution, as has been explained above. Accordingly, both short-circuiting and breaks can be prevented.

As has been described, the connection ends 64a, 64b and the connection ends 64c, 64d, respectively contain common patterns and the respective common patterns are projected onto the same location on the wafer 13. Therefore, the wafer 13 is exposed to these common patterns twice, with individual exposures providing a linearly varying dose so that the total dose in this area of the wafer 13 is substantially the same as the dose received by other exposed regions of the wafer 13. Even if the projected patterns of adjacent fields are slightly misaligned as projected onto the wafer 13, the linearly varying dose connects the patterns smoothly.

During pattern transfer, the shaping-aperture image scans the field 63a in the x-direction. The exemplary shaping-aperture images 77, 79 formed near or on the axis AX (i.e., near the center of the field 63) exhibit little distortion and these images are approximately square (corresponding to the square beam-shaping aperture 5). The exemplary shaping-aperture image 75 that is further displaced from the axis AX exhibits increased distortion, and is generally barrel-shaped or pincushion-shaped.

The electron beam EB is scanned in the x-direction and simultaneously vibrated in the y-direction with the beam-vibration deflectors 6 at a frequency high enough to smooth current-density variations and to illuminate the y-connection ends 72, 73. For example, the shaping-aperture image vibrates in the y-direction on the mask 9 while being scanned in the x-direction across the field 63a. The vibration amplitude is approximately the y-direction width of the y-connection ends 72, 73. The vibrating shaping-aperture image dwells only briefly at the extreme edges 72a, 73a of the respective y-connection ends 72, 73. Inner edges 72b, 73b receive a longer exposure. Generally, combining the dose received by the wafer 13 for exposure of y-connection ends produces a uniform exposure for the y-connection ends. Exemplary mask and scan parameter values are listed below.

| Exemplary Mask and Scan Parameters | |
|---|---|
| field width | 1.04 mm |
| y-width of y-connection ends 72, 73 | 0.04 mm |
| Shaping-aperture image (undistorted) | 1 mm square |
| Shaping-aperture image scanning speed | $2 \cdot 10^4$ mm/sec (1 mm/50 $\mu$s) |
| Vibration amplitude | 0.04 mm |
| Vibration frequency | 20 MHZ |
| Demagnification | 0.25 |

Figure 6:
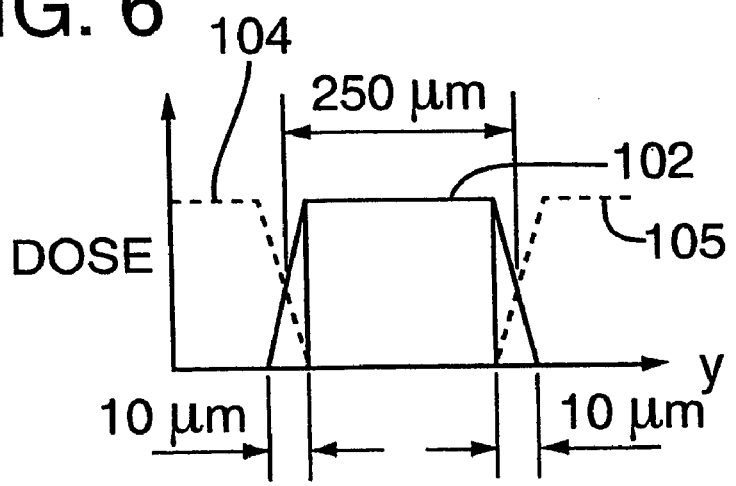
FIG. 6 is a graph of dose as a function of position along a direction of vibration of the shaping-aperture image produced by exposures from adjacent fields.

As discussed above, the y-connection ends 72, 73 facilitate connection of patterns in adjacent fields along y-directed edges. With reference to FIG. 6 dose as a function of y-position on the wafer 13 in a region corresponding to the connecting ends of the fields 63a, 63a' is shown. A curve 102 (solid line) indicates the dose received on the wafer 13 for the field 63a and curves 104, 105 (dashed lines) indicate dose received for adjacent fields. Because the patterns are projected onto the wafer 13 with a demagnification of ¼ (i.e., 0.25), the width of the y-connection ends 72, 73 on the wafer 13 is 10 $\mu$m. Summing the doses represented by the curves 102, 104, 105 produces a substantially uniform dose.

The vibration of the image of the beam-shaping aperture 5 in the y-direction can be of various types. In one exemplary type of vibration, the shaping-aperture image moves at a constant speed in the +y-direction and then reverses to move at the same speed in the −y direction. This type of vibration is referred to as a "triangular" vibration.

With such a vibration, portions of the connection ends in the periphery of the field 63a receive a lower dose than more central portions because the exposure time is less for the peripheral regions. Consequently, the dose as a function of y-position is linear in regions corresponding to the y-connection ends 72, 73, as indicated by the sloped regions of the curves 102, 104, 106. Other types of vibration can also be used, including sinusoidal and saw-tooth vibrations, depending on the illumination uniformity in the shaping-aperture image.

As shown in FIG. 3, the exemplary shaping-aperture images 75, 77, 79 exhibit distortion dependent on displacement from the axis AX. The shaping-aperture images 77, 79 are on or closer to the axis AX and exhibit less distortion than the shaping-aperture image 75. For exposure of the y-connection ends 72, 73, the vibration amplitude is adjusted in by subtracting the distortion from the y-width of the y-connection ends 72, 73. The distorted shaping-aperture image extends further into the y-connection ends 72, 73 than an ideal, undistorted image so that a smaller vibration amplitude is sufficient for proper exposure. Thus, the vibration amplitude in the off-axis portions of the field 63a is slightly smaller than the amplitude in the more on-axis portion.

Vibration also provides a more uniform exposure throughout the field 63a. If the shaping-aperture image is distorted, the distortion causes the dose in the subfields 200, 210, 220 to differ, even if the electron beam EB uniformly illuminates the beam-shaping aperture 5. Vibrating the shaping-aperture images 75, 77, 79 in the y-direction improves dose uniformity. The amplitude of the vibration can be varied in proportion to the extent of distortion in the shaping-aperture image at the wafer 13.

It will be understood that many changes and substitutions may be made by those skilled in the art without departing from the spirit and the scope of the invention, which is defined by the appended claims.

We claim:

1. A method for making a mask for transferring a circuit pattern to a wafer, comprising:

(a) dividing the circuit pattern into a plurality of pattern segments including overlapping pattern portions; and (b) defining the pattern segments on the mask to form a plurality of fields so that the overlapping pattern portions define connection ends.

2. The method of claim 1, further comprising separating the fields on the mask with unpatterned areas.

3. A mask made by the method of claim 2.

4. A pattern-transfer apparatus for transferring a pattern defined by a mask and divided into a plurality of fields to a wafer or other substrate, comprising:

(a) an illumination system that illuminates a selected field on the mask with a charged-particle beam, the illumination system including a shaping aperture that is imaged by the illumination system on the mask;

(b) deflectors situated to deflect an image of the shaping aperture so that the image scans or steps across the selected field;

(c) a beam-vibration deflector situated to vibrate the image of the shaping aperture on the mask at a frequency sufficient to increase uniformity of the charged-particle beam at the substrate; and (d) a projection-lens system situated to receive the charged-particle beam transmitted by the mask and form an image of the patterns in the selected field on the substrate.

* * * * *

UNITED STATES PATENT AND TRADEMARK OFFICE
CERTIFICATE OF CORRECTION

PATENT NO. : 6,307,209 B1
DATED : October 23, 2001
INVENTOR(S) : Nakasuji et al.

It is certified that error appears in the above-identified patent and that said Letters Patent is hereby corrected as shown below:

<u>Title page,</u>
After last cited U.S. PATENT DOCUMENT, please insert the following:

-- FOREIGN PATENT DOCUMENTS
63-001032    1/1988    Japan --

<u>Column 5,</u>
Line 34, "62, 62''" should be -- 62, 62' --.
Line 36, "62''" should be -- 62' --.
Line 50, "63''" should be -- 63' --.

<u>Column 8,</u>
Line 21, "a full-passage" should be -- full-passage --.
Line 67, "receive" should be -- received --.

<u>Column 9,</u>
Line 10, "such that the" should be -- such as the --.

Signed and Sealed this

Thirteenth Day of January, 2004

JON W. DUDAS
*Acting Director of the United States Patent and Trademark Office*